(12) United States Patent
Yamaguchi et al.

(10) Patent No.: US 6,697,492 B1
(45) Date of Patent: Feb. 24, 2004

(54) DIGITAL SIGNAL PROCESSING ACOUSTIC SPEAKER SYSTEM

(75) Inventors: Hirohisa Yamaguchi, Tsukuba (JP); Yoshito Higa, Tsukuba (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/300,043

(22) Filed: Apr. 27, 1999

(30) Foreign Application Priority Data

May 1, 1998 (JP) .......................................... 10-122075

(51) Int. Cl.[7] .................................................. H03G 5/00
(52) U.S. Cl. ........................................ 381/103; 381/94.3
(58) Field of Search ............................... 381/56, 57, 58, 381/59, 66, 93, 103, 102, 101, 94.3

(56) References Cited

U.S. PATENT DOCUMENTS 4,628,526 A * 12/1986 Germer ........................ 381/57
5,509,081 A * 4/1996 Kuusama ..................... 381/103
5,818,945 A * 10/1998 Makino et al. ............... 381/66

* cited by examiner

Primary Examiner—Ping Lee
(74) Attorney, Agent, or Firm—Robert D. Marshall, Jr.; W. James Brady, III; Frederick J. Telecky, Jr.

(57) ABSTRACT

A technique for realizing high-speed and high-precision acoustic reproduction using acoustic speakers. The audio signal processing system has a sub-band analysis filter bank that divides the entire frequency band of an input audio signal into multiple sub-bands. Filter coefficient calculation circuits identify equalizable sub-bands and compares equalizable sub-bands and corresponding sub-bands from output audio signals in order to calculate filter coefficients. A sub-band convolution filter bank and a filter circuit perform frequency convolution on calculated filter coefficients for equalizable sub-bands and process input audio signals on the basis of this convolution.

7 Claims, 5 Drawing Sheets

DIGITAL SIGNAL PROCESSING ACOUSTIC SPEAKER SYSTEM

FIELD OF THE INVENTION

The present invention pertains to a method for reproducing true source sound from acoustic speakers using digital signal processing (DSP) technology.

BACKGROUND OF THE INVENTION

With the unprecedented increase in the use of multimedia information and the introduction of high-definition digital TV broadcasting, high-quality acoustic sound has become an essential element for producing a more realistic feel over what was produced in the past.

Acoustic waves generated by conventional acoustic speakers contain significant distortion because of the physical limitations on the mechanical structure of the speaker. Regardless of careful processing in-studio, or recording high-quality digital data using media such as digital audio tapes (DAT) or compact disks (CD), actual acoustic waves generated by conventional acoustic speakers are normally very different from the original source sounds and from high-precision reproductions of raw source sounds.

FIG. 1a shows a typical conventional acoustic system, and FIG. 1b shows typical frequency characteristics. In these FIGS., source sounds recorded on sound source 100, such as a compact disk, are converted to acoustic output by acoustic speaker 104 via amplifier 101, control amplifier 102, and power amplifier 103. Distortion in the reproduced audio is produced in the various stages, that is, the amplifiers 101, 102, and 103, and acoustic speaker 104.

FIGS. 2a and b represent the difference between original source sound and acoustic output measured using a reference microphone.

FIG. 3 shows an acoustic reproduction system defined as a signal processing box provided with input/output characteristics $H(\omega)$. This acoustic reproduction system can be viewed as unknown box 110 that has known (measurable) input/output characteristics (distortion).

So this creates the problem of whether an additional signal processing box or filter that has inverse characteristics $H^{-1}(\omega)$ can be placed somewhere in this system, and if the original high-quality source sound can be restored in the output from acoustic speakers.

A filter is used as the measure for solving the present problem. FIG. 4 shows an acoustic speaker system that uses an inverse filter for high-quality acoustic reproduction. As is clear from the FIG., filter 115 with inverse characteristics $H^{-1}(\omega)$ is inserted between power amplifier 103 and acoustic speaker 104.

In the past, some research was carried out to achieve an ideal system that has flat amplification and linear phase characteristics. In theory, there are two approaches to this. In short, there is a time domain algorithm and a frequency domain algorithm. All approaches up to now have used only time domain algorithms. With this approach, the inverse filter coefficient is found with the method shown in FIG. 5, and filter coefficient $w_{IK}$ is updated adaptively so that the difference between original input audio signal 120 and output 121 from an acoustic is minimized. Filter coefficient calculation circuit 122 in FIG. 5 illustrates calculation of filter coefficient $w_{IK}$ with least squares method (LMS) algorithm 123 and the coefficient found here is given to filtering processing circuit 124.

The Kalman filtering theory is well-known. With this, updating of filter coefficient $w_{IK}$ is orthogonal to filtering error $e_k$. This error $e_k$ is the difference between output delayed by delay circuit 125 and output filtered by filtering processing circuit 126 of filter coefficient calculation circuit 122. Delay $z^{-\Delta}$ is required to compensate for filtering delay. Expressed mathematically, filter coefficient updating is given by the equation below.

$$w(k+1) = w(k) + \frac{\alpha}{x(k)^T x(k)} e(k) x(k)$$

Here, filter coefficient $w_{IK}$ and input signal $x_K$ are both given in the form of specific vectors.

The filter coefficient can be found by using either actual audio signals or reference white noise as input. Use of the latter has been shown to give a more accurate filter coefficient. However, in a dynamic environment, acoustic speaker characteristics must be compensated for adaptively, and actual signals must be used as input and the filter coefficient must be calculated adaptively.

A conventional approach of this type that obtains filter coefficients in time domain is simple, so it is often applied to actual practice. However, it has the important problems described below.

FIG. 6 illustrates typical actual acoustic speaker characteristics. It shows equalizable frequency range and unequalizable frequency range.

Due to physical limitations of acoustic speakers, a general characteristic of acoustic speakers, as shown in FIG. 6, is that they undergo significant attenuation in very low frequency bands and in very high frequency bands. This phenomenon is caused by physical limitations in speaker structure, and since it is generally a nonlinear property, there is the concern that trying to restore these characteristics will lead to acute deterioration in all speaker characteristics.

A conventional approach to recover acoustic signals in time domain tries to extract filter coefficients independently from this phenomenon. For this reason, rather than being satisfactory, it has led to gradual unexpected deterioration in acoustic speaker characteristics.

SUMMARY OF THE INVENTION

The present invention, in order to solve the aforementioned problems in the prior art, uses an audio signal processing method where the entire frequency band of input audio signals is divided into multiple sub-bands, equalizable sub-bands are recognized from each sub-band and at the same time a filter coefficient is found by comparing the equalizable sub-bands and corresponding sub-bands from output audio signals, and frequency convolution calculates a filter coefficient for the calculated sub-band, and input audio signals are processed based on this convolution.

Also, the audio signal processing system associated with the present invention has a sub-band analysis filter bank that divides the entire frequency band of input audio signals into multiple sub-bands, a filter coefficient calculating circuit that identifies equalizable sub-bands from each sub-band and at the same time calculates filter coefficients by comparing equalizable sub-bands and corresponding sub-bands from the output audio signals, and a processing circuit that performs frequency convolution on calculated filter coefficients for equalizable sub-bands and processes input audio signals based on this convolution.

Also, the digital signal processing device associated with the present invention is equipped with a data memory for storing data, a program memory for storing command programs, a multiplier, and a control unit. The aforementioned control unit enables control of writing of data to the aforementioned data memory and control of the aforementioned multiplier in response to command programs stored in the aforementioned program memory. The aforementioned data memory stores data for multiple sub-bands obtained by dividing input audio signals into multiple frequency bands and data for multiple sub-bands obtained by dividing reference audio signals into multiple frequency bands. The aforementioned program memory stores command programs for multiplying the ratio of the data for each sub-band of the aforementioned audio signals and the data for each sub-band of the aforementioned reference audio signals by the aforementioned filter coefficient in order to correct filter coefficients found from each sub-band for the aforementioned input audio signals and from each sub-band for the aforementioned reference audio signals, and for storing the results of said multiplication. The aforementioned control unit enables multiplication of the aforementioned ratio and the aforementioned filter coefficient by the aforementioned multiplier and stores the corrected filter coefficient in the aforementioned data memory.

Here "equalize" means to restore distorted signals to original signals.

With the present invention, the entire frequency band of the input audio signal is divided into multiple sub-bands and only equalizable sub-bands from among those sub-bands are equalized to find a filter coefficient. So it will be possible to filter audio signals appropriately and to reproduce original source sound with high precision, without causing deterioration/attenuation in low frequency and high frequency bands of the acoustic speaker as in the past.

DESCRIPTION OF THE EMBODIMENTS

Next, a preferred embodiment of the present invention is explained. This preferred embodiment uses a frequency domain filter.

Figure 7:
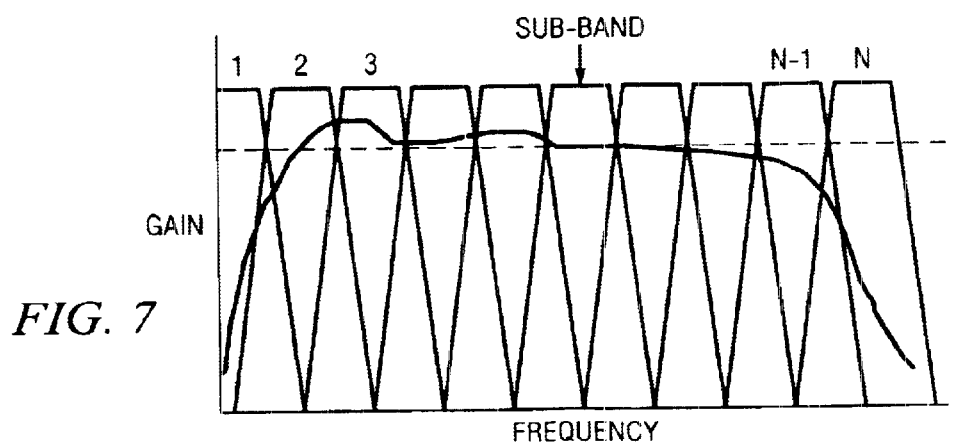
FIG. 7 is a diagram showing all frequencies divided into multiple sub-bands.

The problems discussed as issues in the prior art are solved by dividing the entire frequency band into multiple sub-bands and equalizing each sub-band individually. Unequalizable frequency bands are not equalized. For example, in FIG. 7, the entire frequency band is divided into N sub-bands, and sub-bands 1, N−1 and N are excluded from equalization because they are unsuitable. Whether or not a sub-band can be equalized can be checked, for example, by inputting a frequency reference sine wave within the sub-band to the acoustic speaker and measuring the intensity or distortion level of the output signal. When the output signal intensity is smaller than a threshold value, or when harmonic distortion is greater than a certain threshold value, it is judged that the corresponding sub-band cannot be equalized. With a method such as this, by scanning the entire frequency band, all the sub-bands that can be equalized and the sub-bands that cannot be equalized can be identified.

Figure 8:
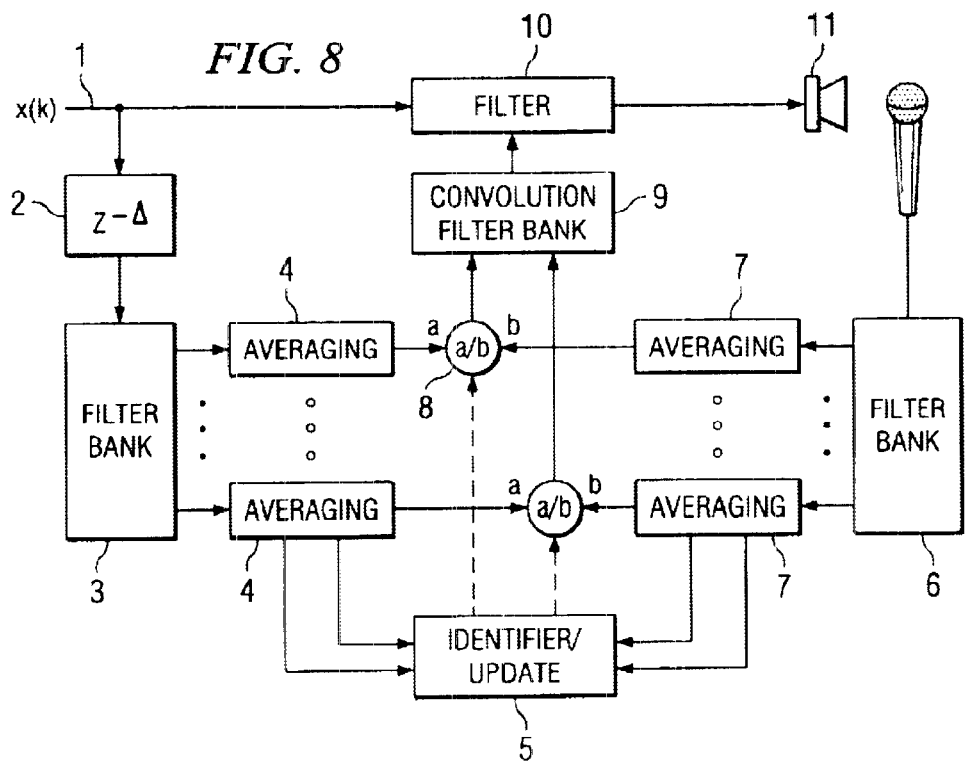
FIG. 8 is a block diagram showing the constitution of an inverse filter used in a preferred embodiment of the present invention.

In FIG. 8, an example of the construction of an inverse filter using this preferred embodiment is shown.

FIG. 8 illustrates an input audio signal 1, a delay circuit 2 that delays input audio signal 1, a sub-band analysis filter bank 3 that divides the audio signal into sub-bands and stores them, a plurality of averaging circuits that average individual signal intensity for each sub-band, an equalizing sub-band identifier circuit/adaptive coefficient updating circuit 5 that identifies equalized sub-bands as well as adaptively updating the filter coefficient, a sub-band analysis filter bank 6 that subdivides output acoustic sound obtained via a microphone and stores them, a plurality of averaging circuits 7 that average individual signal intensity for each sub-band, a plurality of multiplication circuits 8 that multiply the filter coefficient by the ratio (a/b) of output a from a corresponding averaging circuit 4 and output b from a corresponding averaging circuit 7, a sub-band convolution filter bank 9 that frequency synthesizes output from multiplication circuits 8 and converts the frequency domain filter coefficient to a time domain filter coefficient, a filtering circuit 10 that filters input audio signal 1 based on the filter coefficient from sub-band convolution filter bank 9, and an acoustic speaker 9 that outputs filtered audio signals.

Input audio signal 1 to acoustic speaker is first broken down into sub-bands in sub-band analysis filter bank 3 via delay circuit 2. A high-speed Fourier transform can be used for sub-band breakdown. The audio signal that is broken down into each sub-band is input to averaging circuit 4 and there each sub-band is averaged. Each sub-band output includes interference components from adjacent sub-bands and this will hamper equalizing. The sub-band output is averaged to eliminate this, and the interference components can be largely suppressed by this. This processing is applied in exactly the same way to sub-band analysis filter bank 6 and averaging part circuit 7 from the sampled output acoustic sound.

Next, in order to determine equalizable sub-bands and unequalizable sub-bands, outputs from the averaging circuits 4 are supplied to equalized sub-band identifier circuit/adaptive coefficient updating circuit 5 and the characteristics of each sub-band are checked. Simultaneously, output audio signals from the acoustic speaker are also divided into sub-bands, and output with averaged sub-band output is supplied to equalized sub-band identification circuit/adaptive coefficient updating circuit 5.

Also, errors are found from the difference for each sub-band of the output audio signal corresponding to each sub-band of the input audio signal in equalized sub-band identification circuit/adaptive coefficient updating circuit 5, and a filter coefficient is found using, for example, the least squares method widely used in the past to keep error to a minimum (references include R. G. Brown, P. Y. C. Hwang "Introduction to Random Signals and Applied Kalman Filtering," Wiley, etc.).

Next, each multiplication part circuit 8 forms the ratio of output a of a corresponding averaging circuit 4 from the input audio signal and output b of a corresponding averaging circuit 7 from the output audio signal and multiplies by the filter coefficient obtained for equalizable sub-bands. This is because equalizing is performed in frequency domain and is analogous to the difference in magnitude in time domain. This means, it corrects errors.

The actual filter coefficient between signals is obtained by inverse conversion (frequency convolution) of the results. For this purpose, sub-band convolution filter bank 9 receives output from each multiplication circuit 8 and performs frequency convolution on them to convert to a time domain filter coefficient.

Figure 1A:
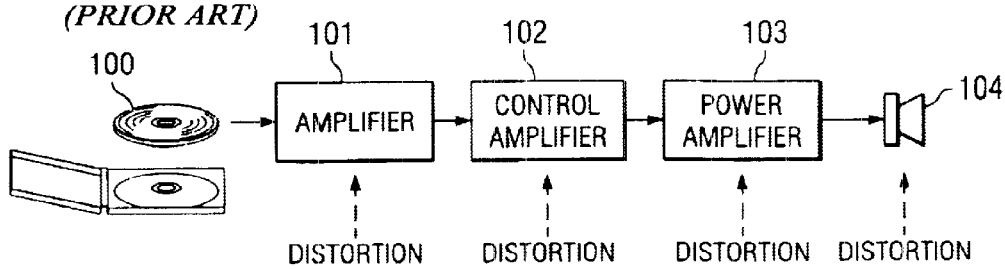
FIG. 1a is a diagram showing a typical conventional acoustic system.
Figure 1B:
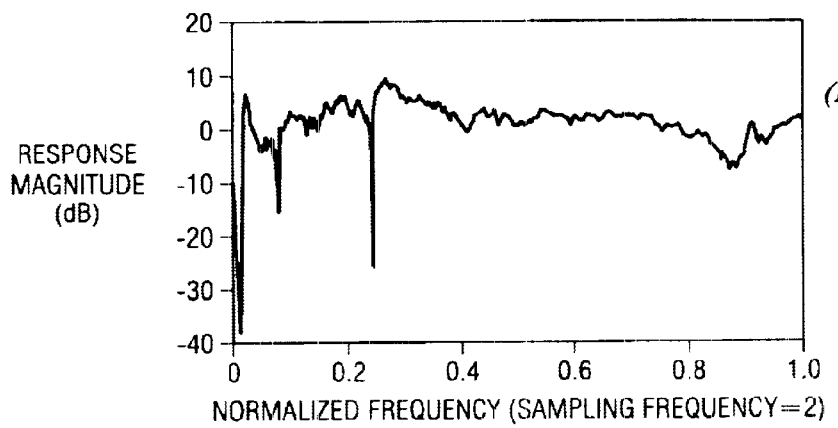
FIG. 1b is a diagram showing typical frequency characteristics.
Figure 2A:
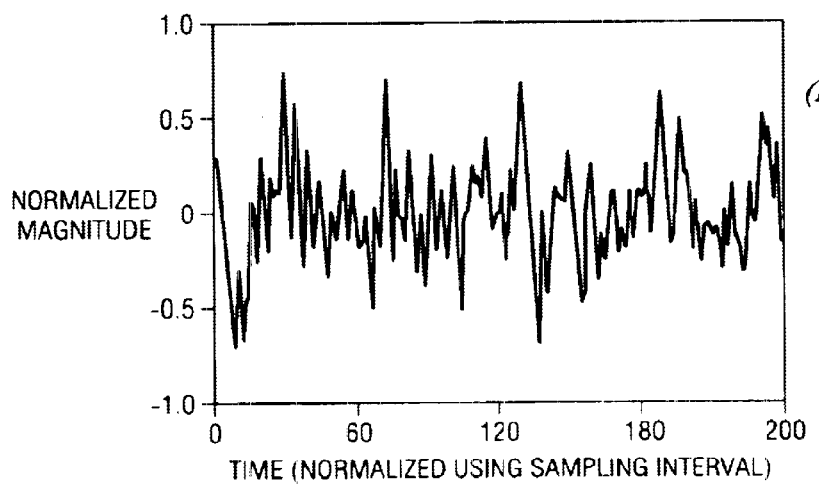
FIG. 2a is a diagram showing the original source sound waveform.
Figure 2B:
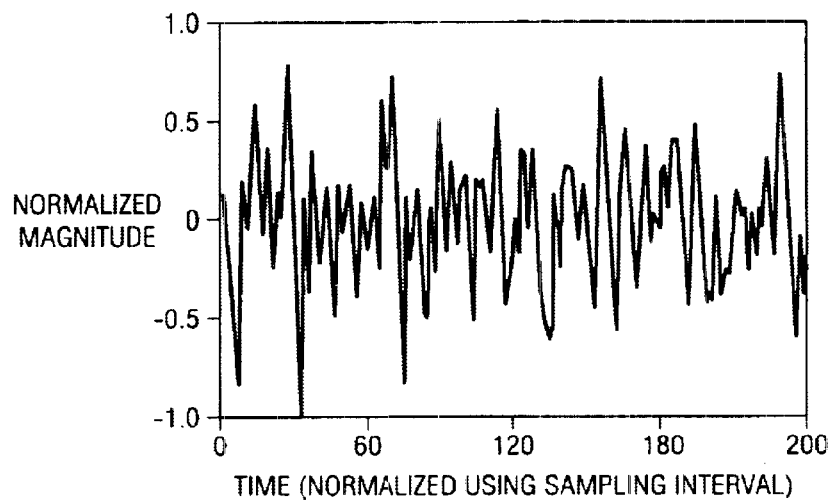
FIG. 2b is a diagram showing the waveform of acoustic output from an acoustic speaker.
Figure 3:
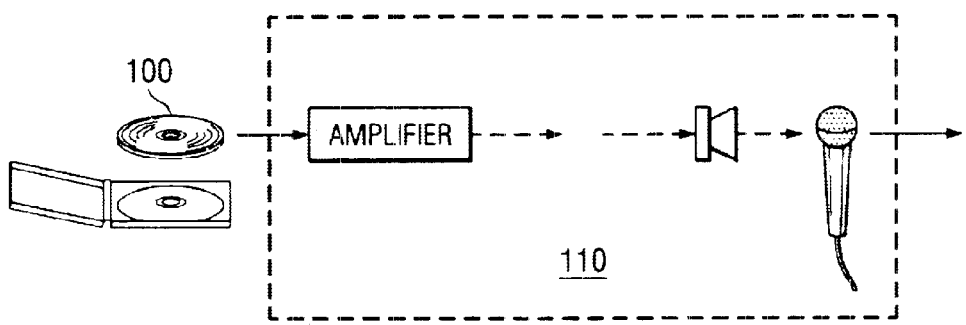
FIG. 3 is a diagram showing an acoustic reproduction system defined as a signal processing box that has input/output characteristics H(ω)
Figure 4:
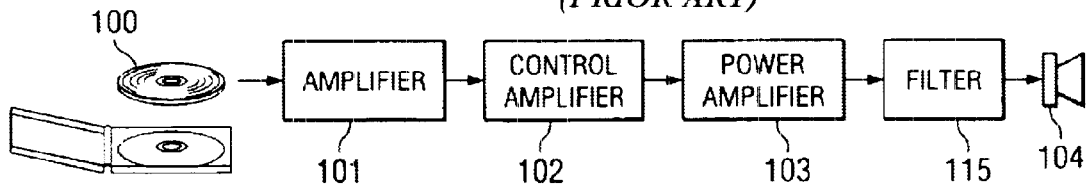
FIG. 4 is a diagram showing an acoustic speaker system that uses an inverse filter for high-quality acoustic reproduction.
Figure 5:
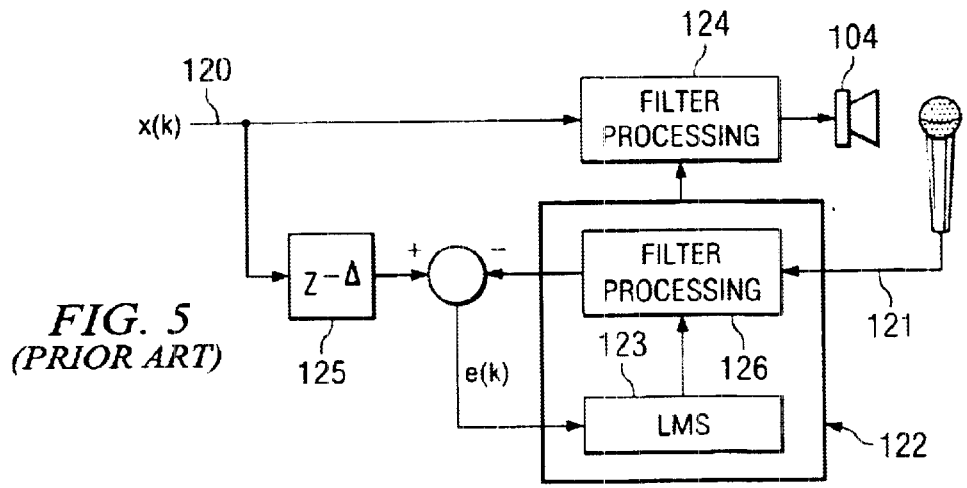
FIG. 5 is a diagram showing calculation of filter coefficient $w_{IK}$ using LMS algorithm.
Figure 6:
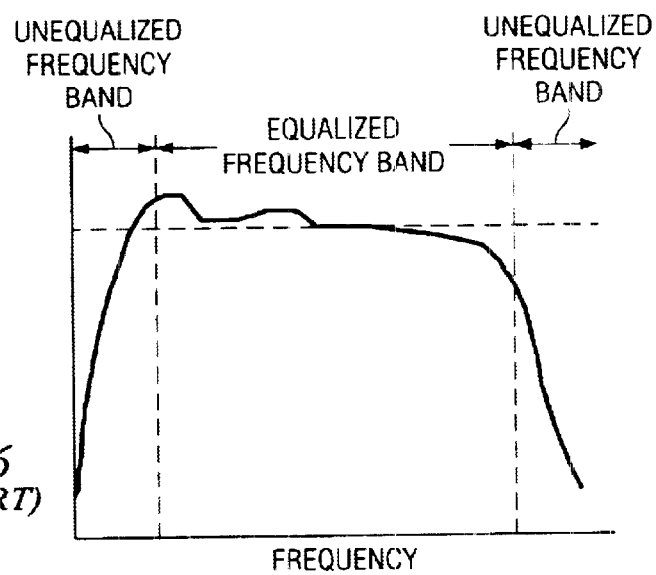
FIG. 6 is a diagram showing typical actual acoustic speaker characteristics.

For the filtering operation, consideration should be given to replacing the convolution in FIG. 5 discussed in the explanation of the conventional example with simple multiplication (product). This is because time domain convolution corresponds to filter coefficient multiplication in frequency domain. That is, it is an expression of filter coefficient frequency domain. These coefficients must be smoothed by averaging, which was already discussed, to remove any aliasing effect.

And when actual audio signals are used to extract filtering coefficients, it must be taken into consideration that gradually, coefficients are used with sub-bands that only have a small amount of signal power and the calculations become unstable because of this. An adaptive coefficient update block can prevent updating of the filter coefficients in a low signal power environment and prevents the system from becoming unstable.

Figure 9A:
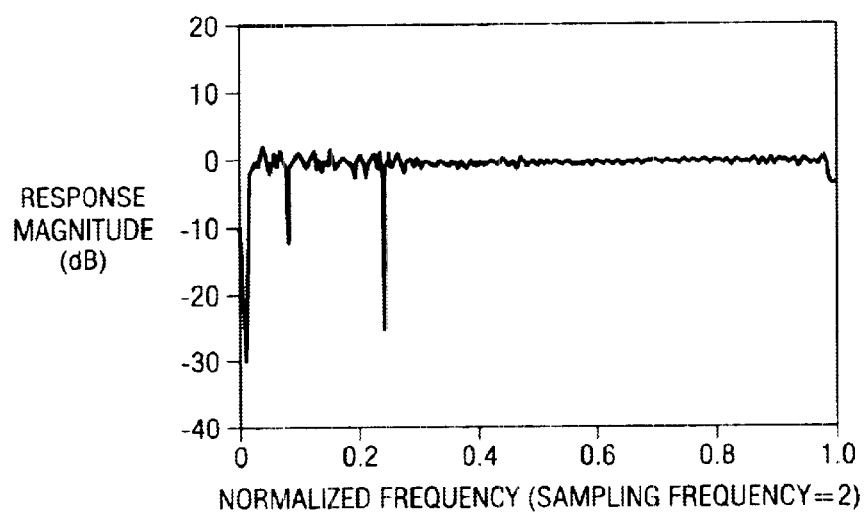
FIG. 9a is a diagram showing frequency characteristics of a compensating acoustic system.
Figure 9B:
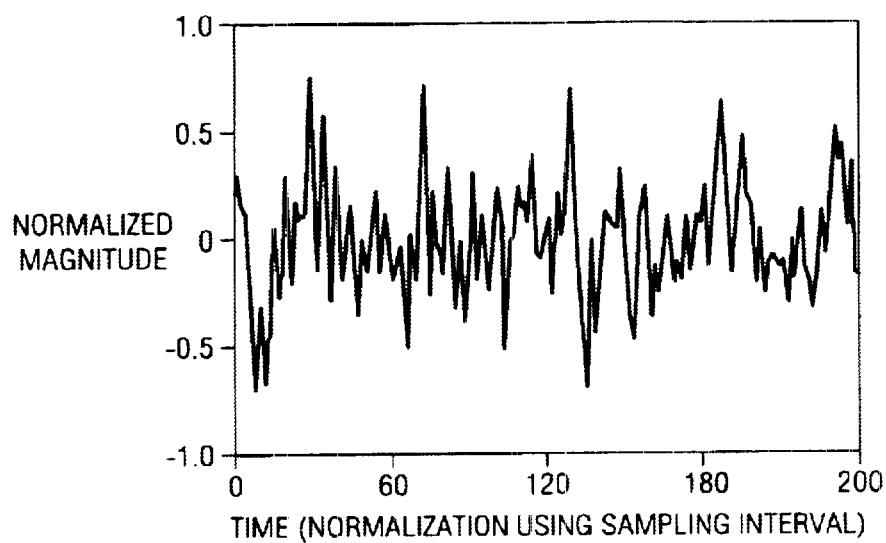
FIG. 9b is a diagram showing an original source sound waveform.
Figure 9C:
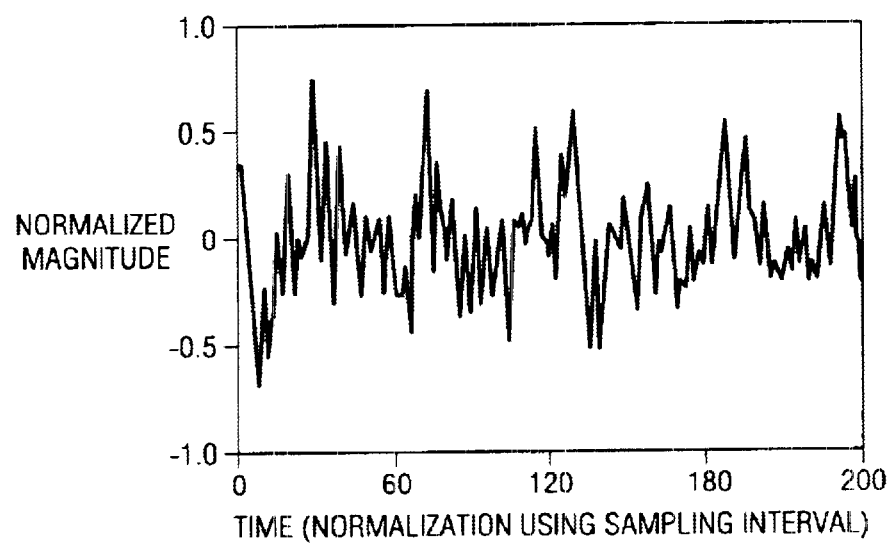
FIG. 9c is a diagram showing processed output waveform from an acoustic speaker.

FIG. 9 shows an example of equalizing characteristics of the frequency domain technique. FIG. 9a shows frequency characteristics of a compensated acoustic system, FIG. 9b shows the waveform of the original source wave, and FIG. 9c shows the processed output waveform from the acoustic speaker.

Figure 10:
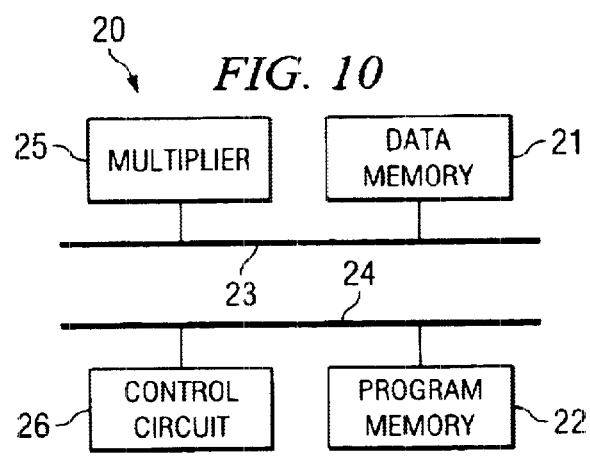
FIG. 10 is a diagram showing features of a DSP used with this preferred embodiment.

FIG. 10 is a block diagram showing an example of this preferred embodiment applied to a digital signal processor (DSP). As shown in the FIG., DSP 20 is typically equipped with data memory 21 for storing data and program memory 22 for storing program commands. These memories are connected by individual buses 23 and 24. Additionally, DSP 20 is equipped with hardware multiplier 25 that enables high-speed calculation, and control circuit 26 controls writing of data to data memory 21 and controls each circuit (details are omitted), such as multiplier 25, in response to program commands.

Data for input audio signals and output audio signals shown in FIG. 8, for example, data for sub-band analysis filter banks 3 and 6, are stored in data memory 21, the program for carrying out equalization is stored in program memory 22, and multiplication for the filter coefficient is executed by multiplier 25. By using a DSP, complex operations that require multiplication can be performed at high speed, so real-time input audio signal processing can be expected.

With the present invention, the acoustic speaker output quality can be improved by a new frequency domain signal processing technique. Dividing acoustic signals into sub-bands, determining nonequalizable sub-bands, and calculating inverse filter coefficients are important items for realizing high quality. By performing these calculations with a digital signal processor, high-speed and high-precision acoustic reproduction with speakers can be realized.

What is claimed is:

1. A method of equalizing the sound from an acoustic speaker comprising the steps of:

dividing an input audio signal to be applied to the acoustic speaker into a plurality of frequency sub-bands;

determining which of said plurality of frequency sub-bands are equalizable;

sampling a sound output of the acoustic speaker;

dividing said sampled sound output into the plurality of sub-bands;

forming a filter coefficient for each equalizable sub-band from the input audio signal and the sampled sound output for the corresponding sub-band to restore distorted sound output from the acoustic speaker;

forming a ratio between the input audio signal of each equalizable sub-band and the corresponding sampled sound output;

multiplying the filter coefficient for each equalizable sub-band by the corresponding ratio to obtain an updated filter coefficient for the corresponding sub-band; and filtering the input audio signal corresponding to the updated filter coefficients for each equalizable sub-band before application to the acoustic speaker.

2. The method of claim 1, wherein:

said step of determining which of said plurality of frequency sub-bands are equalizable includes for each sub-band supplying an input audio signal within the sub-band, determining a magnitude of the sampled sound output for the sub-band, and determining the sub-band is equalizable if the magnitude of the sampled sound output for the sub-band is greater than a predetermined threshold.

3. The method of claim 1, wherein:

said step of determining which of said plurality of frequency sub-bands are equalizable includes for each sub-band supplying an input audio signal within the sub-band, determining a harmonic distortion of the sampled sound output for the sub-band, and determining the sub-band is equalizable if the harmonic distortion of the sampled sound output for the sub-band is less than a predetermined threshold.

4. The method of claim 1, further comprising the steps of:

averaging signal intensity of each sub-band of the input audio signal prior to formation of the ratio; and averaging signal intensity of each sub-band of the sampled sound output prior to formation of the ratio.

5. The method of claim 1, wherein:

said step of forming a filter coefficient for each equalizable sub-band includes employing a least squares method on a difference between the input audio signal for the sub-band and the sampled sound output for the corresponding sub-band.

6. The method of claim 1, wherein:

said step of filtering the input audio signal corresponding to the updated filter coefficients for each equalizable sub-band includes filtering employing a prior filter coefficient if signal power within the corresponding sub-band is less than a predetermined amount.

7. The method of claim 1, wherein:

said step of filtering the input audio signal corresponding to the updated filter coefficients for each equalizable sub-band includes converting the updated filter coefficients from the frequency domain to the time domain.

* * * * *